(12) United States Patent
Woo et al.

(10) Patent No.: US 10,169,257 B2
(45) Date of Patent: Jan. 1, 2019

(54) MODULE BASED DATA TRANSFER

(71) Applicant: Rambus Inc., Sunnyvale, CA (US)

(72) Inventors: Steven Woo, Saratoga, CA (US); David Secker, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 259 days.

(21) Appl. No.: 15/048,690

(22) Filed: Feb. 19, 2016

(65) Prior Publication Data

US 2016/0259739 A1 Sep. 8, 2016

Related U.S. Application Data

(60) Provisional application No. 62/129,696, filed on Mar. 6, 2015.

(51) Int. Cl.
| | |
|---|---|
| G06F 13/16 | (2006.01) |
| G06F 13/40 | (2006.01) |
| G06F 3/06 | (2006.01) |
| G06F 11/00 | (2006.01) |

(52) U.S. Cl.
CPC .......... G06F 13/1673 (2013.01); G06F 3/061 (2013.01); G06F 3/065 (2013.01); G06F 3/0632 (2013.01); G06F 3/0647 (2013.01); G06F 3/0683 (2013.01); G06F 11/00 (2013.01); G06F 13/4068 (2013.01); *Y02D 10/14* (2018.01); *Y02D 10/151* (2018.01)

(58) Field of Classification Search
CPC .................................................. G06F 13/1689
See application file for complete search history.

(56) References Cited

U.S. PATENT DOCUMENTS

| | | | |
|---|---|---|---|
| 6,642,861 B1 * | 11/2003 | Varadarajan | G01R 31/3016 341/57 |
| 8,719,532 B2 | 5/2014 | Jo et al. | |
| 2005/0015664 A1 * | 1/2005 | Johnson | G06F 11/1008 714/15 |
| 2006/0041702 A1 * | 2/2006 | Greenberger | G06F 3/061 710/306 |
| 2007/0086228 A1 | 4/2007 | Choi | |
| 2009/0037764 A1 | 2/2009 | Hinz et al. | |
| 2012/0030414 A1 * | 2/2012 | Jo | G06F 13/1673 711/103 |
| 2014/0068139 A1 | 3/2014 | Osborn et al. | |

FOREIGN PATENT DOCUMENTS

WO WO-2008/121559 A1 10/2008

* cited by examiner

*Primary Examiner* — Farley Abad
(74) *Attorney, Agent, or Firm* — Lowenstein Sandler LLP

(57) ABSTRACT

A method and system for direct memory transfers between memory modules are described that includes sending a request to a first memory module and storing the data sent on a memory bus by the first memory module into a second memory module. The direct transfer of data between the first and second memory modules reduces power consumption and increases performance.

20 Claims, 14 Drawing Sheets

MODULE BASED DATA TRANSFER

RELATED U.S. APPLICATIONS

This application claims the benefit of and priority to the provisional patent application Ser. No. 62/129,696, entitled "MODULE BASED DATA TRANSFER," with filing date Mar. 6, 2015, and is hereby incorporated by reference in its entirety.

BACKGROUND

Increasingly, larger amounts of information are being stored and processed by computing systems. At a base level, these computing systems are configured with one or more processors, each controlling access to corresponding memory. However, the speed of various components limits the overall execution time of operations.

BRIEF DESCRIPTION OF THE DRAWINGS

Further aspects of the present disclosure will become apparent from the following description which is given by way of example only and with reference to the accompanying drawings in which.

DETAILED DESCRIPTION

Figure 1:
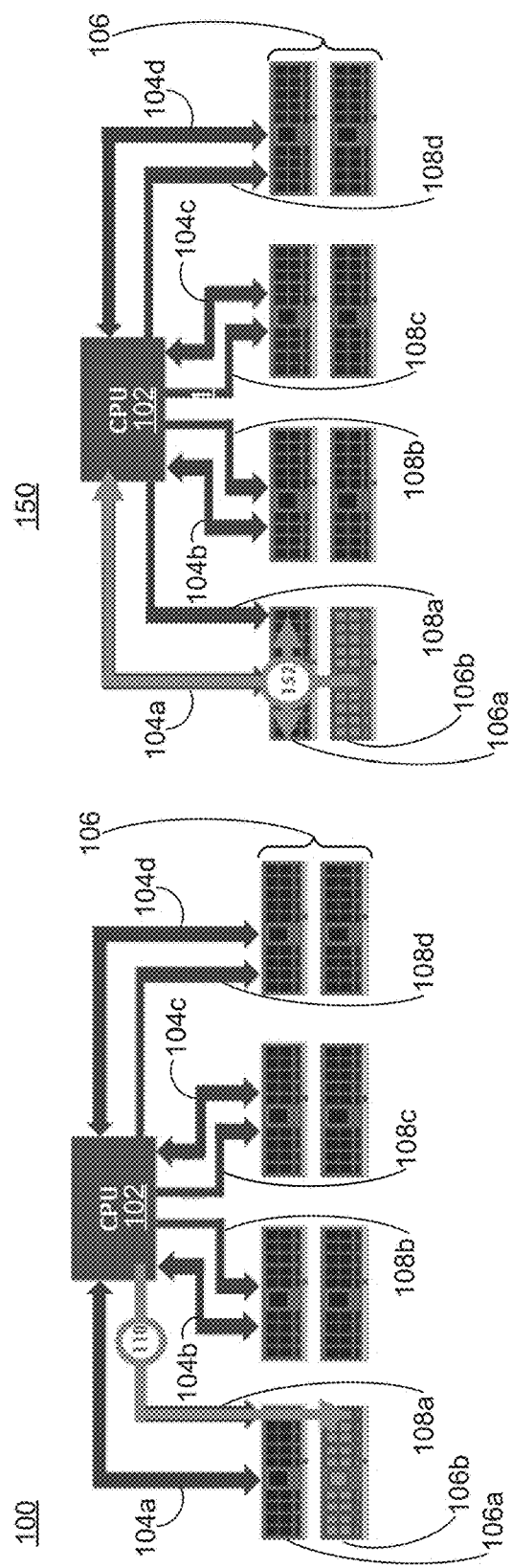
FIGS. 1A-B show operations for reading and writing of data, in accordance with various embodiments.

Reference will now be made in detail to the various embodiments of the present disclosure, examples of which are illustrated in the accompanying drawings. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

There are situations where processing and sifting through data is particularly important. For example, a company may collect large amounts of data on a consumer and based on the consumer clicking two links, the company may attempt to present a third link to the user based on the analysis of the collected data. The company wants to present this third link with the expectation that the consumer will also buy an item associated with the third link. The company wants to promptly present this link so that the company does not miss out on the opportunity to sell the consumer the additional item associated with the third link. System memory is the medium of choice for a computer to be able to store, process, search, and react quickly. However, the process of copying and moving data is relatively slow compared to the speed of data processing by a processor. The process of moving data can be a significant amount of overall execution time while data processing is a small fraction of overall execution time.

Further, movement of the data across memory busses can consume substantial amounts of power. Servers are increasingly moving larger amounts of data on the memory bus, especially in data centers. This increases the power consumed and negatively impacts application performance by increasing latency and bandwidth used to move the data.

In conventional systems, the central processing unit (CPU) manages reads and writes to copy data. The CPU initiates a copy operation by reading the data from the source address. The CPU completes the copy by writing data to the destination address. In a modern server, for example, the data is thus copied from a source memory module to the CPU and then the data is copied from the CPU to the destination memory module. The data thus moves down the memory bus twice: first from the source memory module to the CPU and then second from the CPU to the destination memory module.

The copy bandwidth is therefore half of the peak memory bandwidth because half of the memory bandwidth is used for read operations and the other half of the memory bandwidth is used for write operations. Data being copied thus causes twice as much bandwidth to be consumed to move the data. The transfer latency is the time to perform the read plus the time to perform the write. The latency to move the data is affected by the need to move the data twice, which also consumes power and impacts total cost of ownership (TCO).

Embodiments perform direct data transfers between memory modules to minimize latency, bandwidth, and power used to move data between memory modules on a memory bus. The data is transferred in a single transfer instead of the data being sent over the memory bus twice. Power consumption is reduced as data is transferred from memory module to memory module. Embodiments further increase the speed of data transfers between memory modules.

The FIGS. illustrate example components used by various embodiments. Although specific components are disclosed in the FIGS., it should be appreciated that such components are exemplary. That is, embodiments are well suited to having various other components or variations of the components recited in the FIGS. It is appreciated that the components in the FIGS. may operate with other components than those presented, and that not all of the components of the FIGS. are required to achieve the goals of embodiments.

FIGS. 1A-B show operations for reading and writing data, in accordance with various embodiments. FIGS. 1A-B depict a data transfer from a first memory module to a second memory module within a system. System 100 includes central processing unit (CPU) 102, data buses or memory channels 104a-d, a plurality of memory modules 106, and command/address buses 108a-d. The CPU 102 may be any type of processing component and is not limited to being a CPU. For example, the CPU 102 may be a GPU, co-processor, system on a chip (SoC), etc. Each of memory channels 104a-d may be logical structures having sets of data wires that are shared among each of the memory modules coupled thereto. The command/address busses 108a-d are used to send commands (e.g., read or write commands) and associated addresses.

The plurality of memory modules 106 can include a variety of memory types including dynamic random-access memories (DRAMs), non-volatile memories (NVM), storage class memories (SCMs), etc. For example, one or more of the plurality of memory modules 106 may have NAND memory components. In some embodiments, the plurality of memory modules 106 include Non-Volatile DIMMS (NVDIMMs) or other DIMMs with a combination of volatile and non-volatile memory. In some embodiments, the NVM or SCM modules act as block storage (e.g., a disk). In some embodiments, the NVM storage is operated as block storage, with the system viewing the NVM storage as a solid state disk (SSD). In one embodiment, the memory module 106b is a DIMM with NVM or SCM and the memory module 106a is a DDR4 LRDIMM.

Data in block storage is generally moved to main memory before the data is manipulated by programs. For example, the data is moved to the main memory so that it can be accessed by the CPU. Data manipulation by programs can include CPU operations including floating point operations, logical operations, etc. Embodiments support reading data in the non-volatile RAM (NVRAM) and writing the data to the DRAM. Embodiments are further configured for direct transfer from memory to flash memory on the memory bus. For example, data in NVRAM can be moved to DRAM by putting the data on the memory bus once instead of putting the data on the memory bus twice. This improves performance and reduces power for systems with NVM and SCMs on the memory bus. Embodiments reduce the power used in moving data from NVM and SCM modules to other memory modules.

Referring to FIG. 1A, the CPU 102 initiates a copy operation by sending a read request 110 to the memory module 106b on the command/address bus 108a.

Referring to FIG. 1B, the data is sent on the memory bus or memory channel 104a by memory module 106b in response to the read request. The data travels on the memory bus in both directions (e.g., towards the CPU and away from the CPU). The CPU 102 sends a write request 152 to the memory module 106a. The data is stored by the memory module 106a in response to a write command. In some embodiments, the CPU 102 is coupled to the memory modules 106a-b with independent command busses thereby allowing commands to be sent to the memory modules 106a-b individually and concurrently or substantially concurrently. The data is thus transferred from the memory module 106b to the memory module 106a using half as much bandwidth to perform the copy thereby improving channel utilization. The copying is also done with lower latency and power than if the data was copied to the CPU first and then written out to a memory module.

Figure 2:
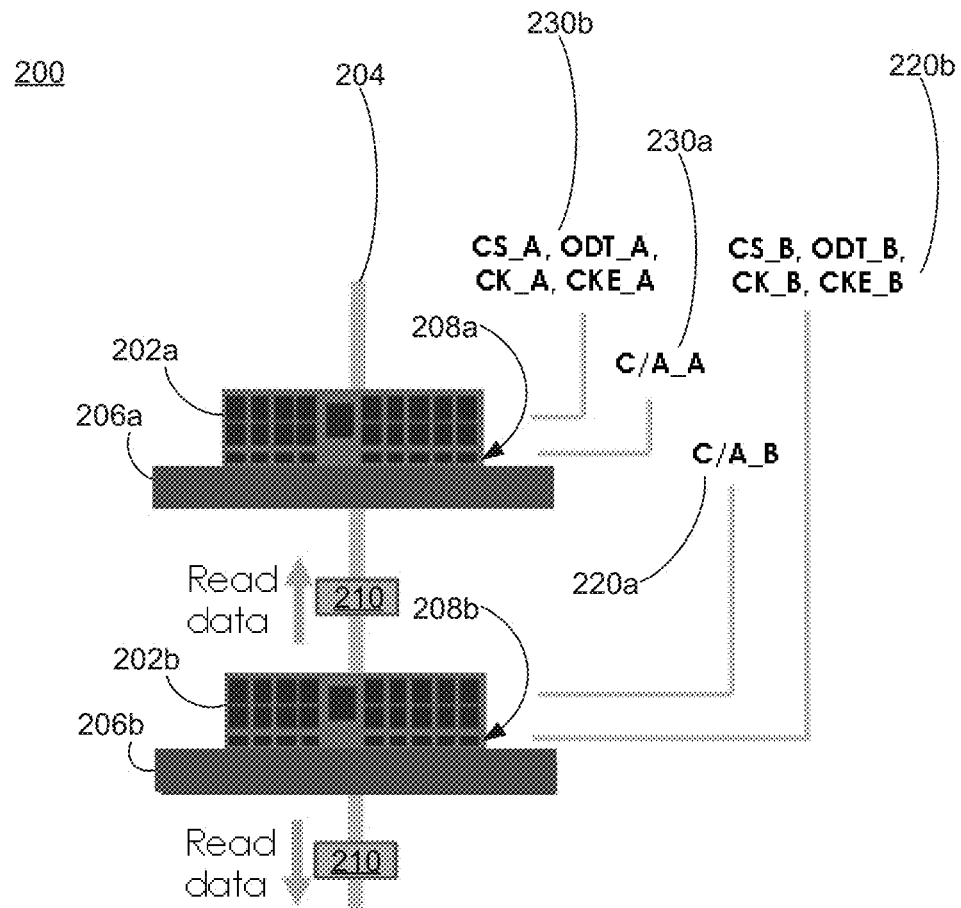
FIG. 2 shows exemplary signaling and data flow, in accordance with various embodiments.

FIG. 2 shows exemplary signaling and data flow, in accordance with various embodiments. FIG. 2 depicts an exemplary copy operation of data between DDR3 memory modules. Exemplary system portion 200 includes memory modules 202a-b, interfaces 206a-b, and a memory channel 204. The interfaces 206a-b include memory module connectors for coupling memory modules 202a-b to the memory channel 204. The memory channel 204 couples memory modules 202a-b and a processing unit. The processing unit can be a CPU, a graphics processing unit (GPU), system on a chip (SoC), etc., or a combination thereof. The signals described herein may be sent to the memory modules by a processing unit of any type, as described herein.

More specifically, FIG. 2 depicts the copying of data from the memory module 202b to the memory module 202a. Unique command/address (C/A) commands to each memory module allow data to be stored at a different module address than it is read from.

Embodiments can support different types of memory coupled to the same bus. For example, the memory module 202a is a DRAM memory module and the memory module 202b is a module with non-volatile memory such as NAND Flash. As another example, direct transfers can be performed between graphic DRAM memory and system.

A processing unit initiates a read operation from the memory module 202b by sending the signals 220a of command/address (C/A_B) and signals 220b of chip select (CS_B), on-die termination (ODT_B), clock (CK_B), and clock enable (CKE_B) to the memory module 202b on a command/address bus. The signals 220a-220b and other C/A_B signals for the memory module 202b are driven at the appropriate times by the processing unit. The read data 210 from the memory module 202b travels down the channel 204 in both directions.

The processing unit initiates a write operation to the memory module 202a by sending the signal 230a of command/address (C/A_A) and the signals 230b of chip select (CS_A), on-die termination (ODT_A), clock (CK_A), and clock enable (CKE_A) to the memory module 202a on a command/address bus. The signals 230a-230b and other C/A_A signals for the memory module 202b are driven at the appropriate times by the processing unit to capture the read data 210 from the memory module 202b as the read data 210 travels on the memory channel 204.

In some embodiments, signals for the write may be driven at the same time or earlier than the read data or the control signals for the read and write can be sent at substantially the same time due to the time offset between the commands and data for these operations. For example, if a command bus is shared, the timing of signals is tailored to enable the direct copy from one memory module to another. The timing could be customized so that the same command bus could be used to issue a read to one memory module and a write to another memory module that will be capturing the data from the data bus. In some embodiments, the proper timings are determined during initialization training.

In some embodiments, the memory modules 202a-b include respective optional buffers 208a-b. For example, the buffers 208a can be configured to shift signals sent from the memory module 202b and received at the memory module 202a. As another example, the buffers 208b can be configured to shift signals from the memory module 202b prior to sending read data 210. In some embodiments, the buffers 208a or the buffers 208b are configured for intra-memory module data buffer transfers between individual buffers of the buffers 208a or between individual buffers of the buffers 208b thereby not having the data being sent out over the memory bus.

Figure 3A:
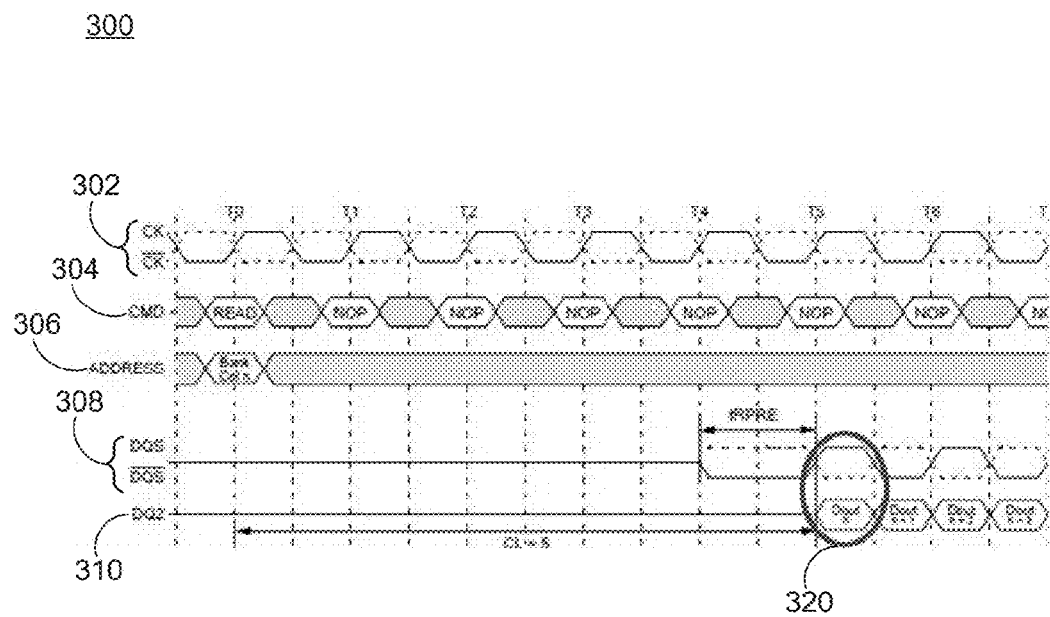
FIGS. 3A-B show exemplary timing diagrams for buffer supported copying where the buffers are configured to transmit signals with different phase alignments, in accordance with various embodiments.
Figure 3B:
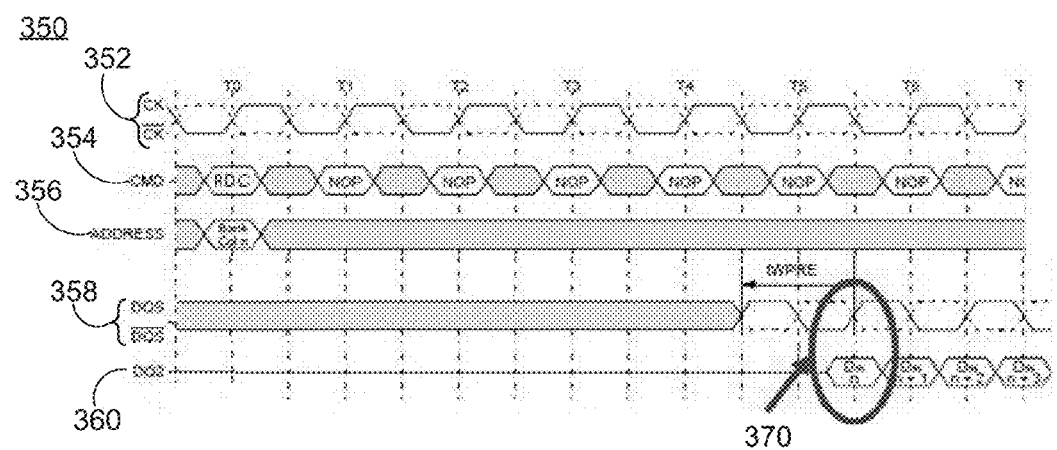

FIGS. 3A-B show exemplary timing diagrams for buffer supported copying where the buffers are configured to transmit signals with different phase alignments, in accordance with various embodiments. FIGS. 3A-B depict exemplary timing diagrams for signaling of DDR3 memory modules with buffers (e.g., the buffers 208a-b) that have the ability to transmit signals with different phase alignments. For example, the data DQ signal and the data strobe (DQS) signal can be received in phase alignment and transmitted with different phase alignments.

It is noted that with DDR3, the memory module transmitting data in response to a read command from the CPU aligns the data and the strobe. Also, under DDR3, the memory module that receives the data and responds to the write command from the CPU expects the data to be 90 degrees offset from the strobe. It is appreciated that for DDR3 when the CPU is sending write data, the strobe and the data signals are offset by 90 degrees. However, when a DDR3 DIMM sends data in response to a read command from the CPU, the strobe and the data are phase aligned. For some embodiments comprising DDR3 memory modules, the phase relationship between the strobe and the data is changed to be offset by 90 degrees by the buffers.

Embodiments can support a "read direct copy" operation via additional signal(s) and/or command encodings. In response to a read command, the buffers of the memory modules transmit DQ and DQS in phase alignment. In response to a read direct copy command, the buffers of the memory module transmit DQ and DQS with a 90 degree offset along with the write preamble. The read direct copy command thus signals a transmitting buffer to shift the data and strobe signals. The 90 degree offset between DQ and DQS allows the receiving memory module to correctly receive and store the data. In some embodiments, one or more cycles may be used to shift a new phase alignment setting into the buffers. In some embodiments, this shift can be done by the transmitting DRAM in the case that the memory module does not have separate buffer chips on it. It is appreciated that this one-time operation for the transfer is amortized over the relatively large data transfer time.

Referring to FIG. 3A, a diagram 300 of read timings for DDR3 memory is shown, in accordance with various embodiments. The clock (CK) diagram 302 represents the clock signal at the DRAM that is the source of the read data. The command (CMD) diagram 304 represents the read command signal at the DRAM that is the source of the data. The address diagram 306 represents the address (e.g., bank and column) that is the source of the data. The data strobe (DQS) diagram 308 represents the data strobe for the data being transmitted on the bus/channel towards the CPU. The data (DQ2) diagram 310 represents the data being transmitted on the bus/channel towards the CPU. Area 320 shows DDR3 read timing signals with DQS and DQ in phase alignment.

FIG. 3B shows a diagram 350 of read direct copy DDR3 timings, in accordance with various embodiments. The clock (CK) diagram 352 represents the clock signal at the DRAM that is the source of the data. The command (CMD) diagram 354 represents the read direct copy command signal at the DRAM that is to transmitting the data. The address diagram 356 represents the address (e.g., bank and column) that is the source of the data. The data strobe (DQS) diagram 358 represents the data strobe for the data being transmitted on the bus/channel towards the CPU. The data (DQ2) diagram 360 represents the data being transmitted on the bus/channel towards the CPU. Area 370 shows DDR3 read direct copy timing signals with DQS and DQ offset by 90 degrees. With DQS and DQ offset by 90 degrees, the memory module receiving the signals (which is instructed to write the data into memory through a write command along with an address containing the bank and column) will receive the proper preamble and interpret the DQ signal as write data.

Figure 4A:
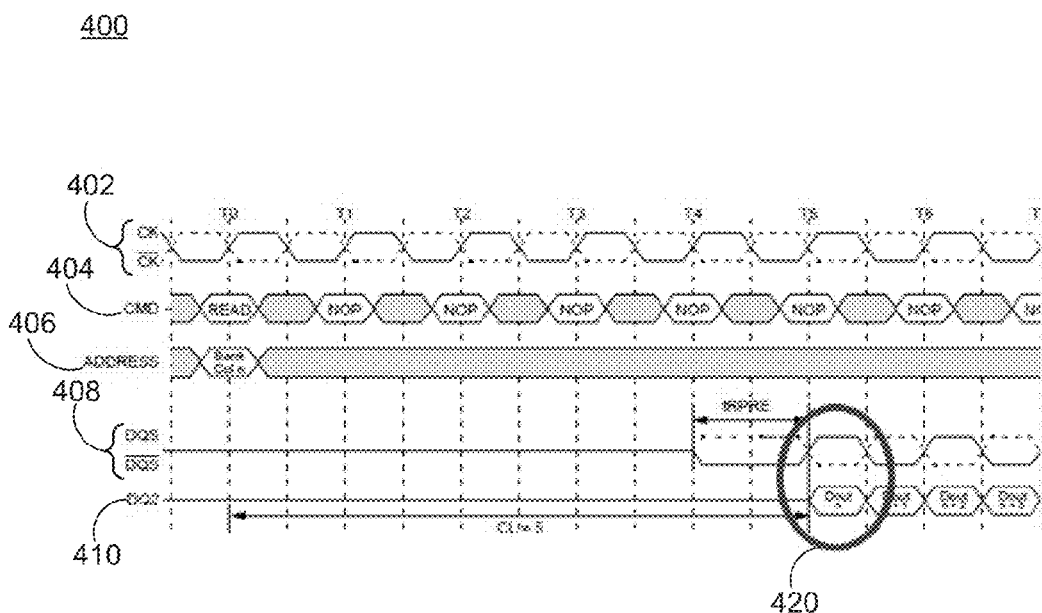
FIGS. 4A-B show exemplary timing diagrams for buffer supported copying where the buffers are configured to shift a received signal alignment, in accordance with various embodiments.
Figure 4B:
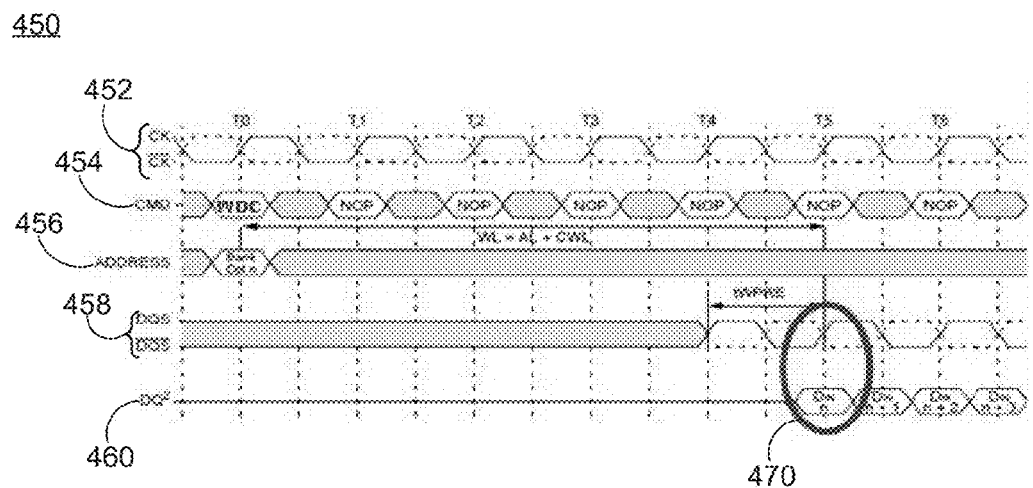

FIGS. 4A-B show exemplary timing diagrams for buffer supported copying where the buffers are configured to shift a received signal alignment, in accordance with various embodiments. FIGS. 4A-B depict exemplary timing diagrams for signaling of DDR3 memory modules with buffers (e.g., the buffers 208a-b) capable of receiving DQ and DQS signals (e.g., from the memory bus) with the same phase alignment and shifting DQ and DQS signals by 90 degrees (e.g., when presenting these signals to the DRAM).

Embodiments can support a "write direct copy" operation via additional signal(s) and/or command encodings. In response to a write command, the memory modules are able to store data based on the DQ and DQS signals offset by 90 degrees. In response to a "write direct copy" command, the memory module receives DQ and DQS phase aligned and the buffers internally shift DQ and DQS to be offset by 90 degrees and the write preamble is transmitted to the memory components (e.g., DRAMs) on the memory module. The write direct copy command thus signals a receiving buffer to shift the data and strobe signals.

In some embodiments, one or more cycles may be used to shift a new phase alignment setting into the buffers. It is appreciated that this one-time operation for the transfer is amortized over the relatively large data transfer time.

FIG. 4A shows a diagram 400 of transmitting DDR3 module's read timings, in accordance with various embodiments. FIG. 4A depicts that the DQS and DQ signals are phase aligned. The clock (CK) diagram 402 represents the clock signal received at the DRAM that is the source of the read data. The command (CMD) diagram 404 represents the read command signal at the DRAM that is the source of the data. The address diagram 406 represents the address (e.g., bank and column) that is the source of the data. The data strobe (DQS) diagram 408 represents the data strobe for the data being transmitted on the bus/channel towards the CPU. The data (DQ2) diagram 410 represents the data being transmitted on the bus/channel towards the CPU. Area 420 shows DDR3 read timing signals with the DQS and DQ signals in phase alignment.

FIG. 4B shows a diagram 450 of write direct copy DDR3 timings, in accordance with various embodiments. The clock (CK) diagram 452 represents the clock signal received at the DRAM that is receiving the data. The command (CMD) diagram 454 represents the write direct copy (WDC) command signal received at the memory module that is to be receiving the data. The address diagram 456 represents the address (e.g., bank and column) where the data is to be stored. The data strobe (DQS) diagram 458 represents the data strobe received by the DRAM that is to store the data. The data (DQ2) diagram 460 represents the data signal received at the DRAM that is receiving the data. Area 470 shows DDR3 write direct copy timing signals with the DQS and DQ signals offset by 90 degrees. With the DQS and DQ signals offset by 90 degrees by the memory module buffers, the DQS and DQ signals are received at the memory components (e.g., DRAMs) with the proper preamble and timing.

Figure 5:
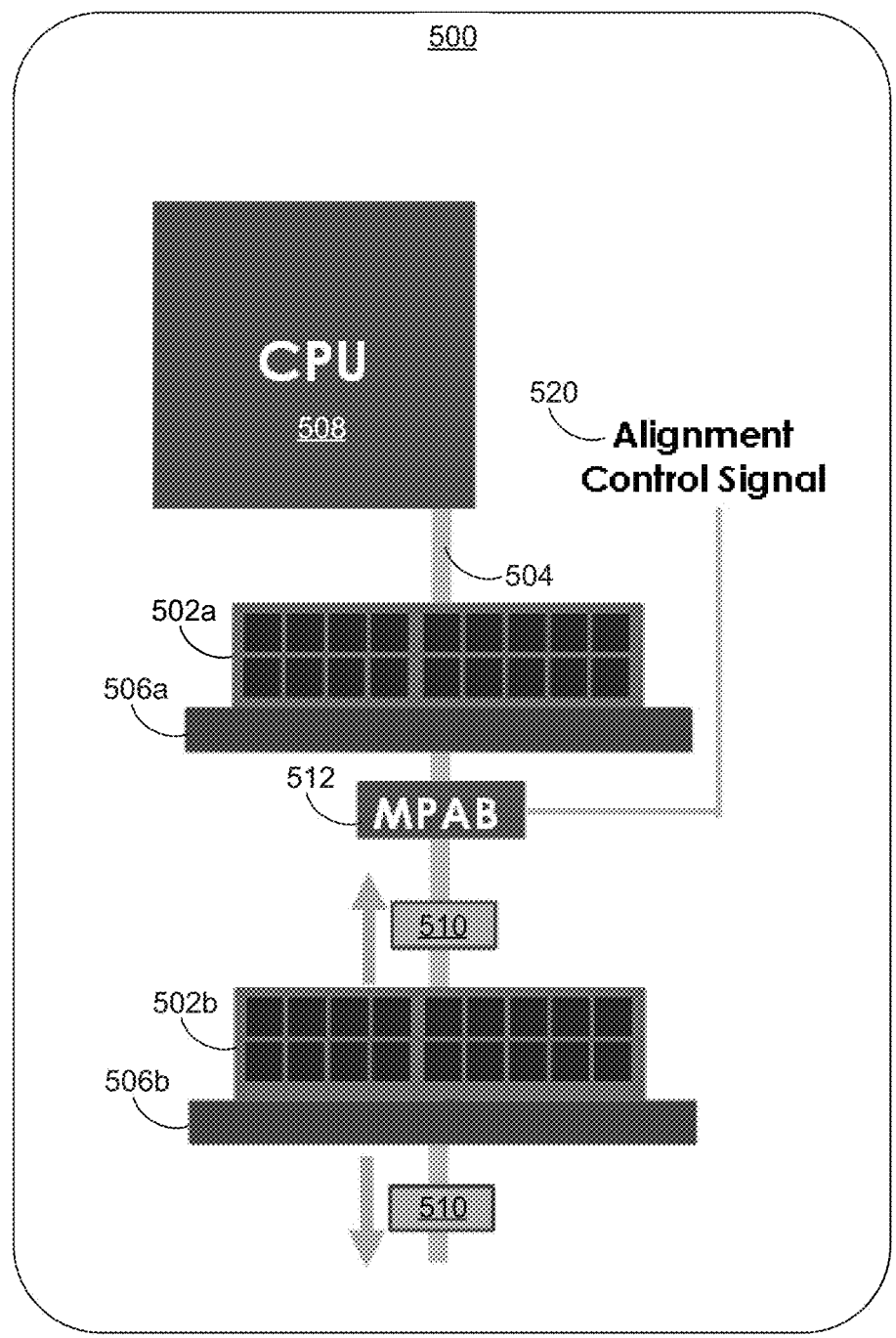
FIG. 5 shows a system configuration with a buffer located on a motherboard, in accordance with various embodiments.

FIG. 5 shows a system configuration with a buffer located on a motherboard, in accordance with various embodiments. FIG. 5 depicts a data transfer from one memory module to another memory module with the use of buffer components external to the memory modules. In some embodiments, the buffer components are on a motherboard. The buffer components are configured to shift the DQ and DQS signal phase alignment. System 500 includes a CPU 508, a memory bus or channel 504, a memory module interfaces 506a-b, memory modules 502a-b, and a multi-phase alignment buffer (MPAB) 512.

The memory module interfaces 506a-b are configured for coupling the memory modules 502a-b to the channel 504. The channel 504 couples the CPU 508, the memory module interfaces 506a-b, and the MPAB 512. The shifting function of the MPAB 512 can be configured by the CPU 508 with an alignment control signal 520. For example, the alignment control signal 520 is used to enable or disable a function of the MPAB to shift DQ and DQS signals by 90 degrees.

The CPU 508 sends a read command to memory module 502b. In response to the read command, the memory module 502b transmits DQ and DQS in phase alignment as data 510. The CPU 508 transmits the MPAB alignment control signal 520 (e.g., on a command/address bus or data bus) and in response the MPAB determines if the DQ and DQS signals are shifted by 90 degrees relative to each other or not. The MPAB 512 sends the shifted DQ and DQS signals on channel 504 in both directions.

Embodiments can include additional signal(s) and/or command encodings to support a new "read direct copy" operation as described herein. In response to a "read direct copy" command to the memory module 502b, the MPAB 512 shifts DQ and DQS 90 degrees relative to each other and the transmits the write preamble.

The CPU 508 issues a write command to the memory module 502a. The memory module 502a then interprets the data correctly based on receiving the DQ and DQS offset by 90 degrees and the write preamble by the MPAB 512.

In some embodiments, one or more cycles may be used to shift a new phase alignment setting from the CPU 508 into the MPAB 512. It is appreciated that this one-time operation for the transfer that is amortized over the relatively large data transfer time.

Figure 6A:
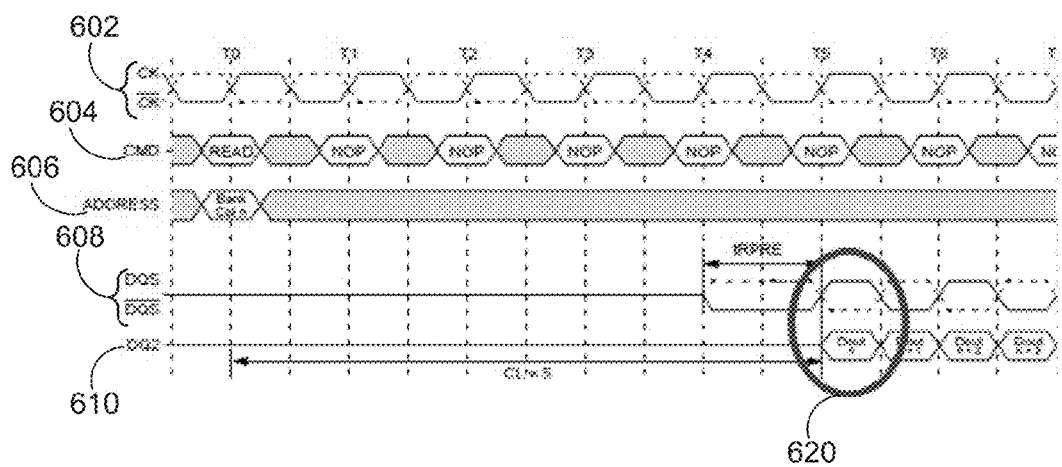
FIGS. 6A-B show timing diagrams for read and write operations of a configuration having a buffer located on a motherboard, in accordance with various embodiments.
Figure 6B:
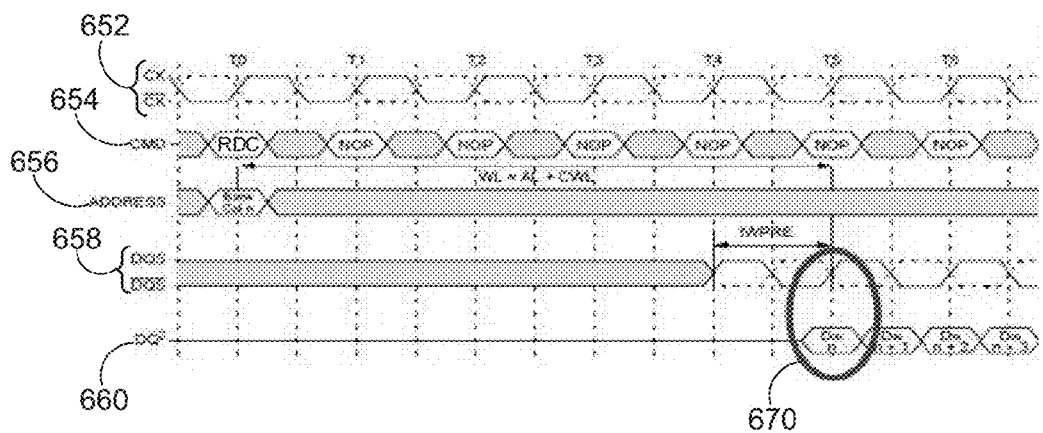

FIGS. 6A-B show timing diagrams for read and write operations of a configuration having a buffer external to the memory module, in accordance with various embodiments. FIGS. 6A-B depict exemplary timing diagrams for signaling of DDR3 memory modules with one or more external buffers capable of receiving DQ and DQS signals with same phase alignment (e.g. from the DRAMs) and shifting the DQ and DQS signals (e.g., by 90 degrees), for example when transmitting these signals onto the memory bus.

FIG. 6A shows a diagram 600 of read timings of a transmitting DDR3 module, in accordance with various embodiments. For example, the read timings of the memory module 502b are shown. FIG. 6A depicts that the DQS and DQ signals are phase aligned. The clock (CK) diagram 602 represents the clock signal at the DRAM that is the source of the read data. The command (CMD) diagram 604 represents the read command signal at the DRAM that is the source of the data. The address diagram 606 represents the address (e.g., bank and column) that is the source of the data. The data strobe (DQS) diagram 608 represents the data strobe for the data being transmitted on the bus/channel towards the CPU. The data (DQ2) diagram 610 represents the data being transmitted on the bus/channel towards the CPU. Area 620 shows DDR3 read timing signals with the DQS and DQ signals in phase alignment in response to the read command.

FIG. 6B shows a diagram 650 of read direct copy DDR3 timings, in accordance with various embodiments. For example, the read direct copy timings of the memory module 502a are shown. The clock (CK) diagram 652 represents the clock signal at the DRAM that is transmitting the data. The command (CMD) diagram 654 shows the Read Direct Copy (RDC) command sent to the DRAM that is transmitting the data. The address diagram 656 represents the address (e.g., bank and column) of the data to be transmitted. The data strobe (DQS) diagram 658 represents the data strobe for the data being transmitted on the bus/channel towards the CPU. The data (DQ2) diagram 660 represents the data being transmitted on the bus/channel towards the CPU. Area 670 shows DDR3 read direct copy timing with the DQS and DQ signals offset by 90 degrees by a buffer (e.g., the MPAB 512, or on-module data buffers) or by the DRAMs themselves. With DQS and DQ signals offset by 90 degrees by the buffer, the DQS and DQ signals are received in a write configured phase alignment at the destination memory module with the proper preamble.

Figure 7A:
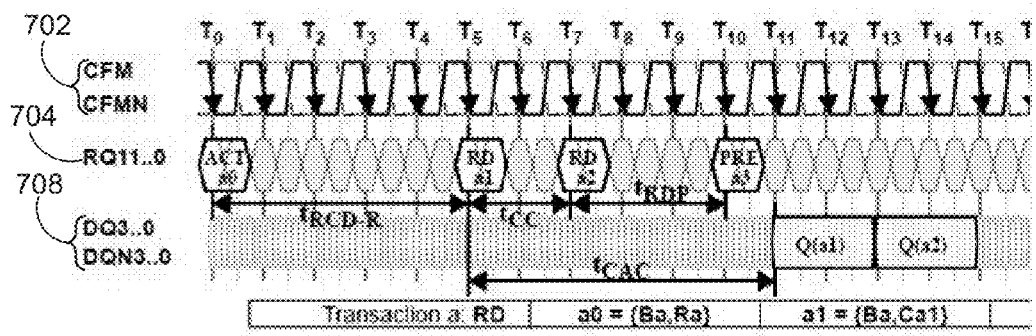
FIGS. 7A-B show timing diagrams of read and write operations for modules without signal shifting, in accordance with various embodiments.
Figure 7B:
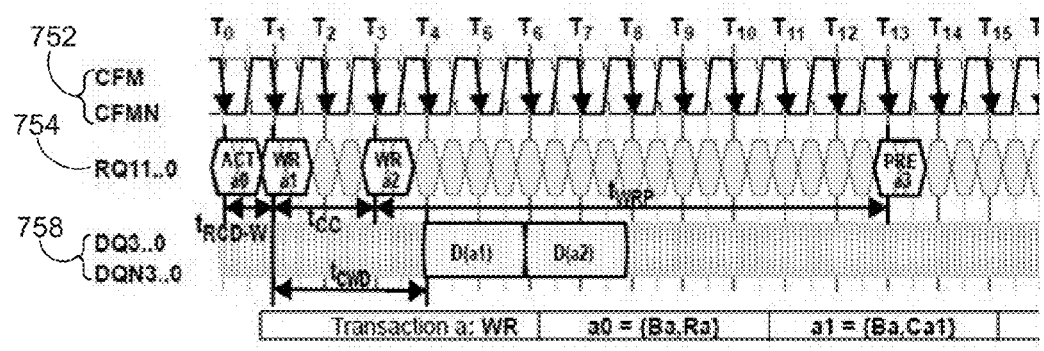

FIGS. 7A-B show timing diagrams of read and write operations for modules without signal shifting, in accordance with various embodiments. FIGS. 7A-B depicts write and read timings for memory modules where signals do not need to be shifted to support write operations and data transfers directly between memory modules. It is noted that FIGS. 7A-B are described with respect to extreme data rate (XDR®) or XDR® 2 DRAMs but embodiments can support memory modules that do not use a strobe signal as well as memory modules that do use a strobe signal. For memory modules that do not use a strobe, there is no difference in the data (e.g., DQ) and strobe (e.g., DQS) relationship for reads and writes. In some embodiments, the data (DQ) alignment to a clock signal is the same for reads and writes and there is no need for special "read direct copy" and/or "write direct copy" operations. The proper timings for sending read and write commands can be determined during initialization training.

FIG. 7A shows a diagram 700 of XDR® read timing. The clock from master (CFM) diagram 702 represents the clock signal at the DRAM that is the source of the read operation data. The request (RQ) diagram 704 represents the command signal at the DRAM that is the source of the data. The data (DQ3) diagram 708 represents the signal at the DRAM that is the source of the data.

FIG. 7B shows a diagram 750 of XDR® write timing. The clock from master (CFM) diagram 752 represents the clock signal at the DRAM that is receiving the data. The request (RQ) diagram 754 represents the command signal at the DRAM that is receiving the data. The data (DQ3) diagram 758 represents the signal at the DRAM that is receiving the data.

Figure 8:
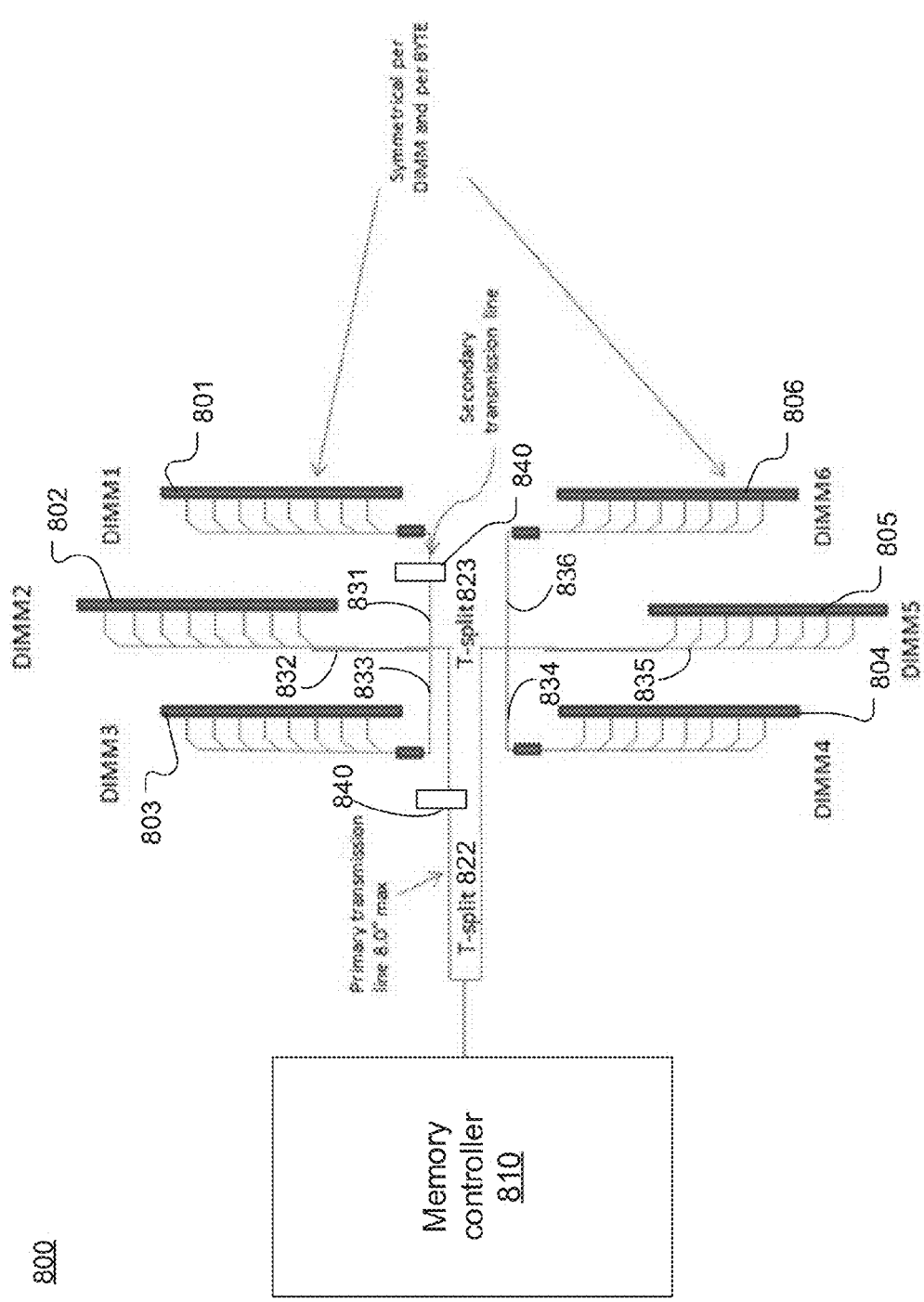
FIG. 8 illustrates an exemplary channel topology in a memory system capable of performing a copy operation from a first memory module to a second memory module, in accordance with various embodiments.

FIG. 8 illustrates an exemplary channel topology in a memory system capable of performing a copy operation from a first memory module to a second memory module, in accordance with various embodiments. FIG. 8 depicts a memory bus configuration with six DIMMs which are in the same latency group or have the same timing. System 800 includes a memory controller 810, T-splits 822 and 823, transmission lines 831-836, DIMMs 801-806 or DIMMs 1-6.

Transmission lines 831-836 couple the DIMMs 801-806 to memory controller 810. Secondary transmission lines 832 and 835 coupled to the DIMMs 2 and 5 from the T-split 823 and are routed with extra lengths to match the trace length of the buses coupled to the DIMMs 1, 3, 4, and 6. Data can be concurrently broadcast to each of the DIMMs coupled to the channel. For example, the DIMM 6 can send data on the channel that can be accessed by, and written, to any of the DIMMs 1-5, as described herein.

The memory controller 810 is configured to send requests including commands to DIMMs 801-806. The memory controller 810 can be implemented as a separate chip or integrated in a host device, such as a CPU, a coprocessor, a GPU, a Field-Programmable Gate Array (FPGA), Application-Specific Integrated Circuit (ASIC), etc.

The memory controller 810 initiates a read operation to the DIMM 802. The read data 840 travels towards the T-split 822 and down the secondary transmission line 831 towards the DIMM 801. The memory controller 810 initiates a write operation to the DIMM 801. It is appreciated that some signals for the write may need to be driven at the same time or earlier than the read data or the control signals for the read due to the timing offset between the commands and data for the operations. In response to the write operation, the DIMM 801 reads the data 840 and writes the data 840 into its memory.

Figure 9:
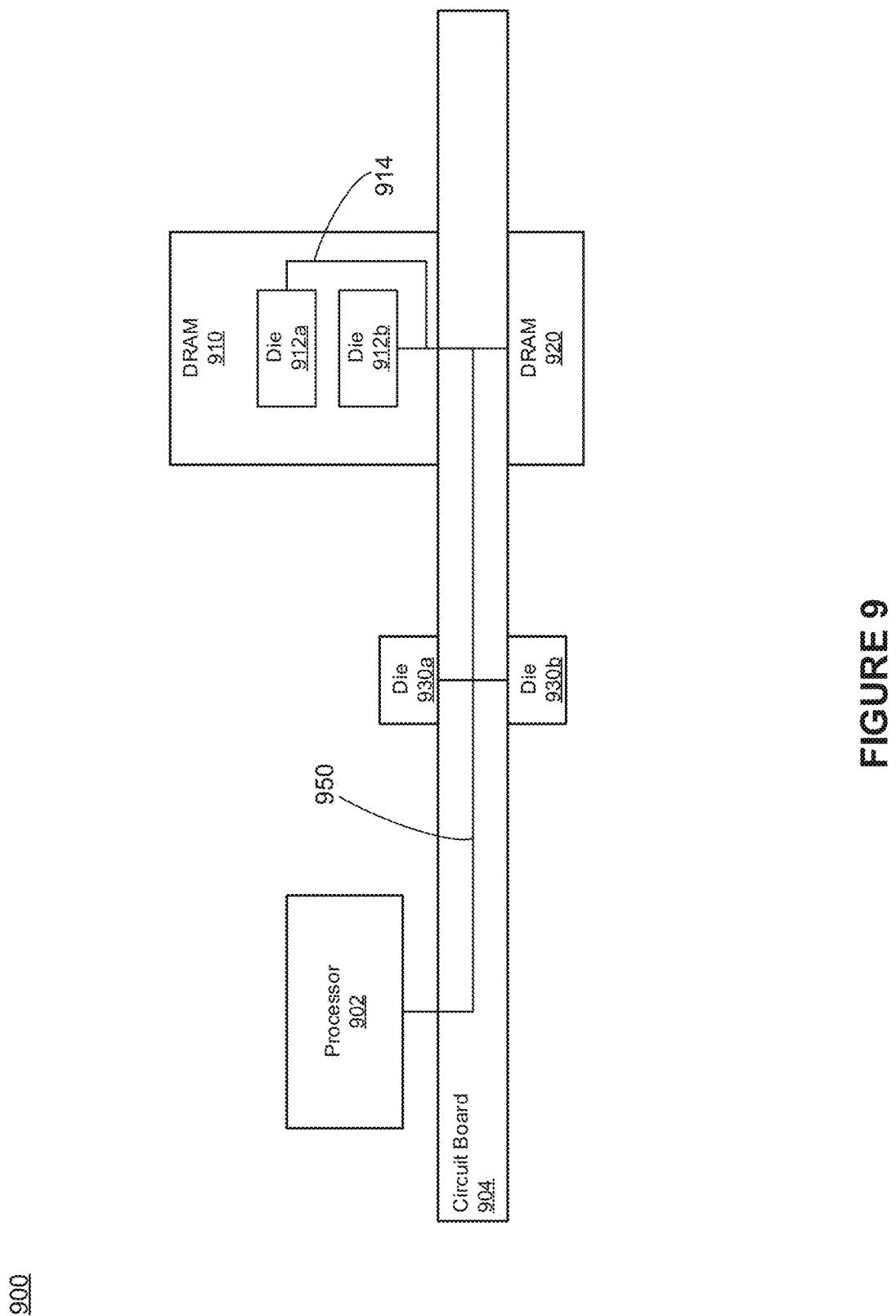
FIG. 9 shows a block diagram of an exemplary system having a variety of memory modules, in accordance with various embodiments.

FIG. 9 shows a block diagram of an exemplary system having a variety of memory modules, in accordance with various embodiments. FIG. 9 depicts a system having additional memory topologies supporting transfers that can include intra module or intra-package transfers. System 900 includes a processor 902, a circuit board 904, dies 930*a-b*, and DRAMs 910-920.

The processor 902 can be a system on a chip (SoC) or any other processing unit, as described herein. The processor 902 is coupled to the circuit board 904 via a memory bus 950. The dies 930*a-b* are coupled (e.g., soldered) to the circuit board 904 and the memory bus 950. In some embodiments, the dies 930*a-b* are coupled to opposite sides of circuit board 904. The DRAMs 910-920 are coupled (e.g., soldered) to circuit board 904 and the memory bus 950. The DRAM 910 includes dies 912*a-b* which are coupled via an internal bus 914 of DRAM 910.

Various data transfers may be performed between the memories and memory modules of system 900. The processor 902 can initiate a direct transfer between the dies 930*a-b*, as described herein. In some embodiments, the dies 912*a-b* can be individually commanded. The processor 902 can initiate a direct transfer between dies 912*a-b* via the internal bus 914, as described herein. The processor 902 can further initiate direct transfers between the DRAM 910, the DRAM 920, and the dies 930*a-b*, as described herein.

Figure 10:
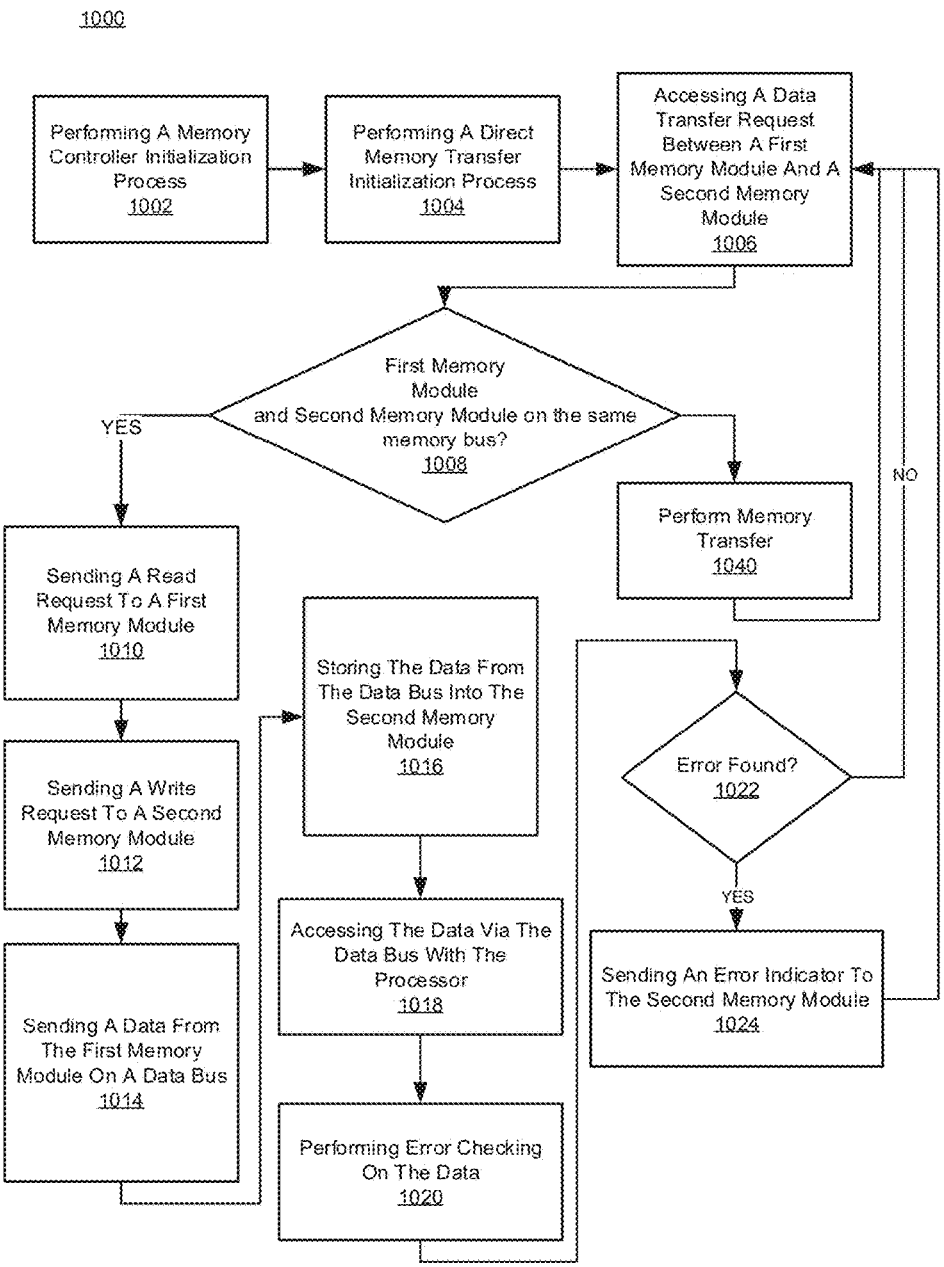
FIG. 10 shows a flowchart of an exemplary electronic component controlled process for reading and writing data, in accordance with various embodiments.

FIG. 10 shows a flowchart of an exemplary electronic component controlled process for transferring data between memory modules, in accordance with various embodiments. FIG. 10 depicts a process 1000 performed by a system comprising a memory controller (e.g., a processor), a first memory module, and a second memory module. It is appreciated that the process 1000 may be a portion of a process performed by a system in handling a variety of requests including request to perform computations, access disk storage, etc.

At block 1002, a memory controller initialization process is performed. The memory controller initialization process is performed for training the signaling of the memory controller for communications with one or more memory modules. The training may include timing and framing adjustments to calibrate communication between memory controller and the memory modules.

At block 1004, an initialization process for a direct transfer of data from the first memory module to the second memory module is performed. The initialization process for direct transfer of data can be performed as described with respect to process 1100.

At block 1006, a data transfer request between a first memory module and a second memory module is accessed. For example, the data transfer request can be a copy request or a move request of an executing program.

At block 1008, whether the first memory module and second memory module are on the same data bus is determined. If the first memory module and second memory module are on the same data bus, block 1010 is performed. If the first memory module and second memory module are on different data buses, block 1040 is performed.

At block 1010, a read request to a first memory module is sent. As described above, a processor may send the read request to the first memory module. In some embodiments, the first memory module comprises a non-volatile memory. In some embodiments, the first memory module comprises a storage class memory.

At block 1012, a write request to a second memory module is sent. The write request includes an indicator that data will be received directly from the first memory module. For example, the indicator indicates that the second memory module will capture data from a data bus that was sent directly from the first memory module.

At block 1014, in response to the read request, data is sent from the first memory on a data bus. The data bus electrically couples the first memory module, the second memory module, and a processor or memory controller.

At block 1016, in response to the write request, the data is stored from the data bus into the second memory module. The second memory module accesses that the data on the data bus as the data travels on the data bus and stores the data. The data stored into the second memory module is received directly from the first memory module via the data bus. In some embodiments, the data may be received from a buffer that has shifted the phase alignment of the data and strobe signals sent by the first memory module (e.g., the MPAB 512). In some embodiments, the data is received by the second memory module and a phase alignment of data and strobe signals is shifted by a buffer on the second memory module.

At block 1018, the data is optionally accessed via the data bus by the processor. The data travels on the data bus in one or more directions and is accessible by a processor. In some embodiments, the processor accesses the data to perform error checking or other operations after accessing the data from the data bus.

At block 1020, error checking on the data is optionally performed. The processor can perform error-correcting code (ECC) checking or other error checking methods on the data to ensure that the data was not corrupted prior to being sent by the first memory module. In some embodiments, the processor may not perform error checking and configures its receivers to tristate or terminate the bus thereby enhancing signal integrity on the channel or memory bus. In some embodiments, error checking can be performed by the buffers of the sending memory module or the buffers of the receiving memory module. For example, the buffers on the memory modules could perform error checking based on a portion of the error checking bits which is less than the number of bits used for ECC across the entire width of the memory bus.

At block 1022, it is determined whether an error was found. The error can be determined by the processor or one or more buffers of the sending and receiving memory modules. If an error was found, block 1024 is performed. If an error was not found, block 1006 is performed.

At block 1024, an error indicator is sent to the second memory module. The processor, upon determining an error, signals the first memory module to stop sending the data and/or signals the second memory module to not store the data from the bus or to stop storing data from the bus because of the detected error. In some embodiments, the buffers on the memory modules send the error indicator based on error checking performed by the buffers.

At block 1040, the memory transfer is performed. The memory transfer can be performed for memory modules that are not on the same bus.

Figure 11:
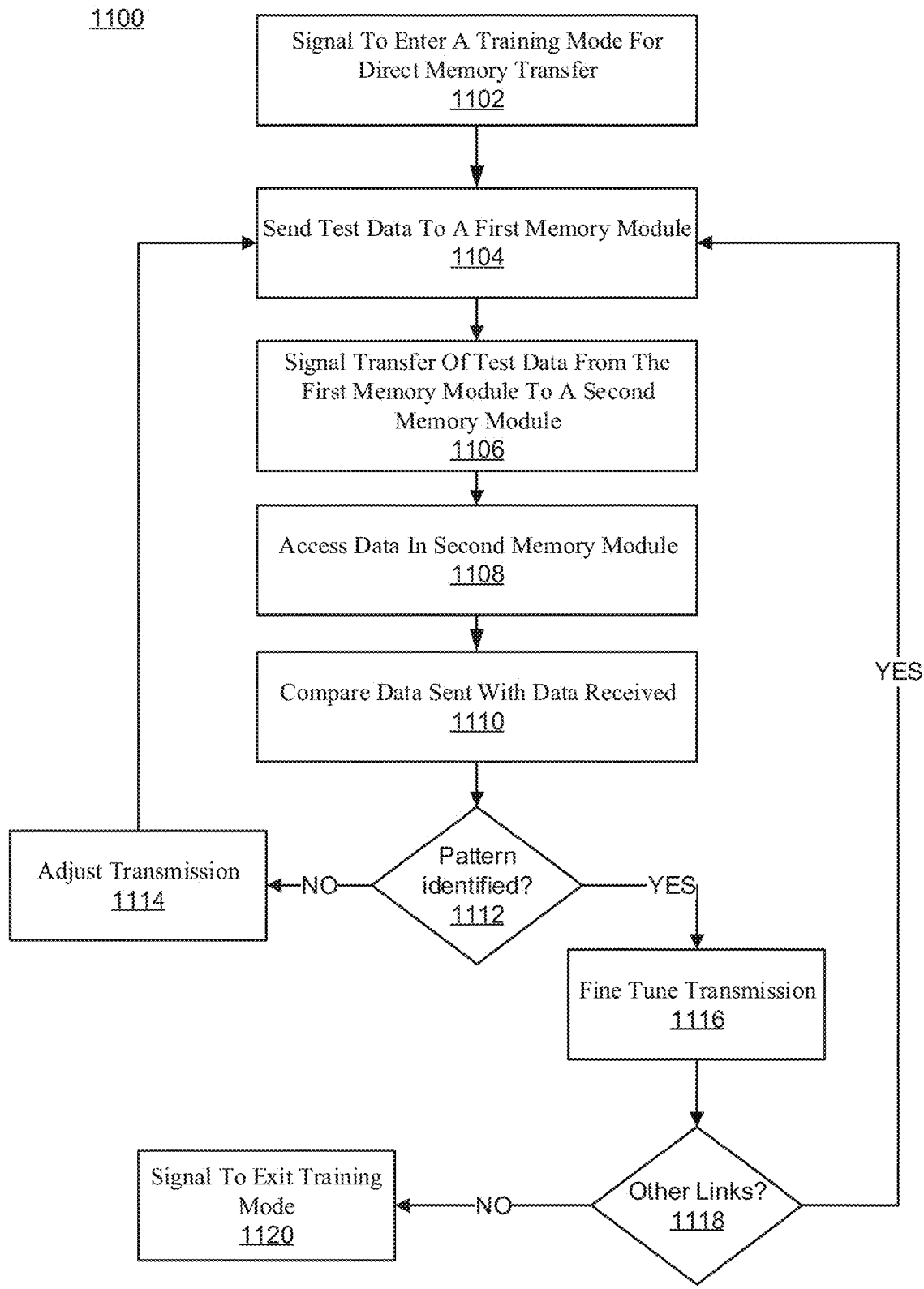
FIG. 11 shows a flowchart of an exemplary electronic component controlled process for initializing memory components, in accordance with various embodiments.

FIG. 11 shows a flowchart of an exemplary electronic component controlled process for initializing memory components, in accordance with various embodiments. FIG. 11 depicts a training process 1100 that can be used during initialization of the system to enable reliable transfers of data directly between memory modules. The process 1100 may be performed by a memory controller (e.g., the memory controller 810, the CPU 102, etc.). The process 1100 can be used to calibrate the transfer of data between memory modules on the same channel or memory bus.

At block 1102, a training mode signal to enter a training mode for direct memory transfer is sent. The training mode signal may be sent by a memory controller to cause a memory module to enter a training mode in which direct transfers between memory modules is performed.

At block 1104, test data is sent to a first memory module. The test data may be test or calibration data that is to be read back after being transferred directly to another memory module. In one embodiment, a memory controller sends the test data.

At block 1106, the transfer of test data from the first memory module to a second memory module is signaled. As described herein, the test data is transferred directly from the first memory module to the second memory module via a channel or memory bus.

At block 1108, data in the second memory module is accessed. The data is accessed from the location in the second memory module where the test data was sent from the first memory module.

At block 1110, the test data and the data from the second memory module are compared. At block 1112, it is determined whether a pattern can be identified based on the comparison of the test data and the data from the second memory module. If a pattern is identified, block 1118 is performed. If a pattern is not identified, block 1114 is performed.

At block 1114, in response to the comparing and/or the pattern identification, the test data sending operation is adjusted. In one embodiment, the adjustment of the sending operation is operable to calibrate the communication of the test data between the first memory module and the second memory module. The adjusting may include timing and framing adjustments to calibrate communication between the first memory module and the second memory module.

At block 1116, transmission between the first memory module and the second memory module is fine tuned. The fine tuning may include sweeping the timing window for an optimal value and adjusting communication accordingly.

At block 1118, whether additional transfers between memory modules should be performed is determined. Each channel or memory bus between two memory modules may be individually calibrated for transfers, as described herein. If there are direct transfers between one or more pairs of memory modules to be calibrated, block 1104 is performed. If there are no additional transfers between memory modules to be calibrated, block 1120 is performed.

At block 1120, a signal to exit the training mode is sent. The signal to exit the training mode may be sent via a command bus to a memory module. In some embodiments, the timings and other settings are used to program phase interpolators for XDR® memory modules.

Figure 12:
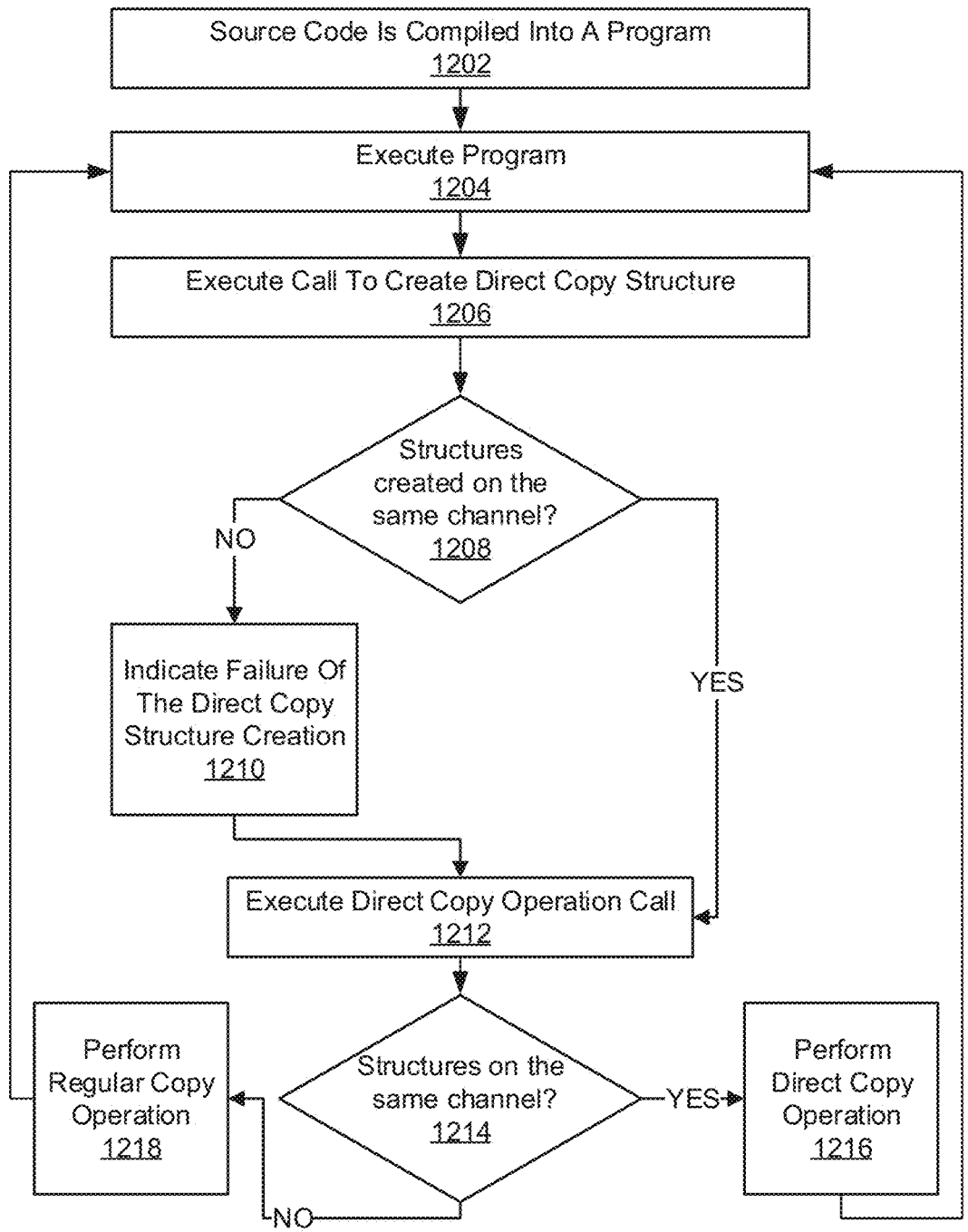
FIG. 12 shows a flowchart of an exemplary computer implemented process for executing a program for reading and writing data, in accordance with various embodiments.

FIG. 12 shows a flowchart of an exemplary computer implemented process for allocating memory on a first memory module and on a second memory module for transferring data directly from the first memory module to the second memory module, in accordance with various embodiments. FIG. 12 depicts a process 1200 for allocating two portions (e.g., blocks) of memory that reside on the same memory channel, associating the two portions of memory, and initiating a data transfer between the two portions of memory. For example, each of the two portions of memory reside on respective memory modules on the same channel.

At block 1202, source code is compiled into a program. The source code can include one or more calls to create direct copy structures and perform direct copy operations, as described below.

At block 1204, the program is launched or executed.

At block 1206, a function call to create a direct copy structure is executed. In some embodiments, a programming mechanism is available to create and identify "direct transfer" data structures. For example, programming language constructs substantially similar to pragma and/or library calls like malloc can be used. In some embodiments, direct transfer data structures can be dynamically allocated where the data structures are allocated to the same physical memory channel.

For example, the allocation of memory for a "direct transfer" data structure is performed by the code of Table 1.

TABLE 1

| Exemplary memory allocation code |
| --- |
| dc_status = dc_malloc (a_host1, a_host2, 1024);<br>if (!dc_status) {<br>  fprintf(stderr, ' 'Cannot dc_malloc\n' ');<br>  stop(0);<br>} |

The dc_malloc function is a customized type of malloc operation that can function substantially similar to malloc and k_malloc. In some embodiments, the dc_malloc invokes the runtime to find a range of contiguous addresses that are free (e.g., on the same channel) and allocates them to the requesting program. The dc_malloc function allocates memory for which a direct transfer will occur.

In some embodiments, the call to "dc_malloc(a, b, size)" allocates "size" bytes over which a direct transfer can occur. The function call "dc_malloc(a, b, size)" sets the pointer "a" to an address at the start of the allocated memory space in one DIMM on a memory channel. The function call "dc_malloc(a, b, size)" sets the pointer "b" to another address on the same memory channel. The pointers "a" and "b" can have the same address alignment to ensure that as the corresponding addresses are traversed, the addresses in "a" and "b" are such that bank/row/column crossings happen for "a" and "b" at the same time. In some embodiments, the direct copy structures are created so that the addresses of each respective structure have matching bank row and column crossings on the memory modules. This avoids situations where accessing data to copy would cross a column boundary and could necessitate two reads for one write operation. The addresses for "a" and "b" can be configured so that there is a 1:1 mapping of physical addresses between two different DIMMs on the memory channel. The direct transfer memory portions can thus be thought of as "bound" together.

In some embodiments, one block of memory is allocated in the memory space and another (e.g., same size block) is allocated in another memory space. The portions of memory can be in the same memory space, e.g., User Space or OS/Kernel space, or one portion can be in User Space and the other portion can be in OS/Kernel space.

At block 1208, whether the direct copy structures were created on the same channel is determined. If the direct copy structures were created on the same channel, block 1212 is performed. If copy structures were not created on the same channel or were not able to be created, block 1210 is performed.

At block 1210, a failure of the direct copy structure is optionally indicated. The program may display an error or can display no error indication. In some embodiments, the program can proceed with execution without direct memory transfers.

At block 1212, a direct copy operation function call is executed. At block 1214, whether the data structures provided are on the same channel is determined. If the data structures are on the same channel, block 1216 is performed. If the data structures are not on the same channel, block 1218 is performed.

For example, a direct copy operation can be performed by the code of Table 2.

TABLE 2

Exemplary direct copy operation code

```
direct_copy_status = direct_copy(a, b, bytes);
if (!direct_copy_status) {
    fprintf(stderr, ' 'Direct Copy FAILED\n' ');
    stop(0);
}
```

At block 1216, the direct copy operation is performed, as described herein.

At block 1218, a regular copy operation is performed. The copy operation is performed at a lower speed than a direct copy operation.

The process 1200 thus allows a programmer create a data structure that will be used to copy data from one location to another location. The program requests the creation of the structures by the operating system on the same memory channel. If the operating system is unable to create the structures, the program will still execute but may not be able to do a direct copy and may not be as fast as if there was a direct copy. The runtime determines where memory will be allocated from and allocates memory for the direct copy structures. The runtime further receives (or intercepts) the direct copy function call and determines whether the data structures of the direct copy function call are on the same memory channel. If the data structures are not on the same channel, the copy will be performed as a conventional copy.

Figure 13:
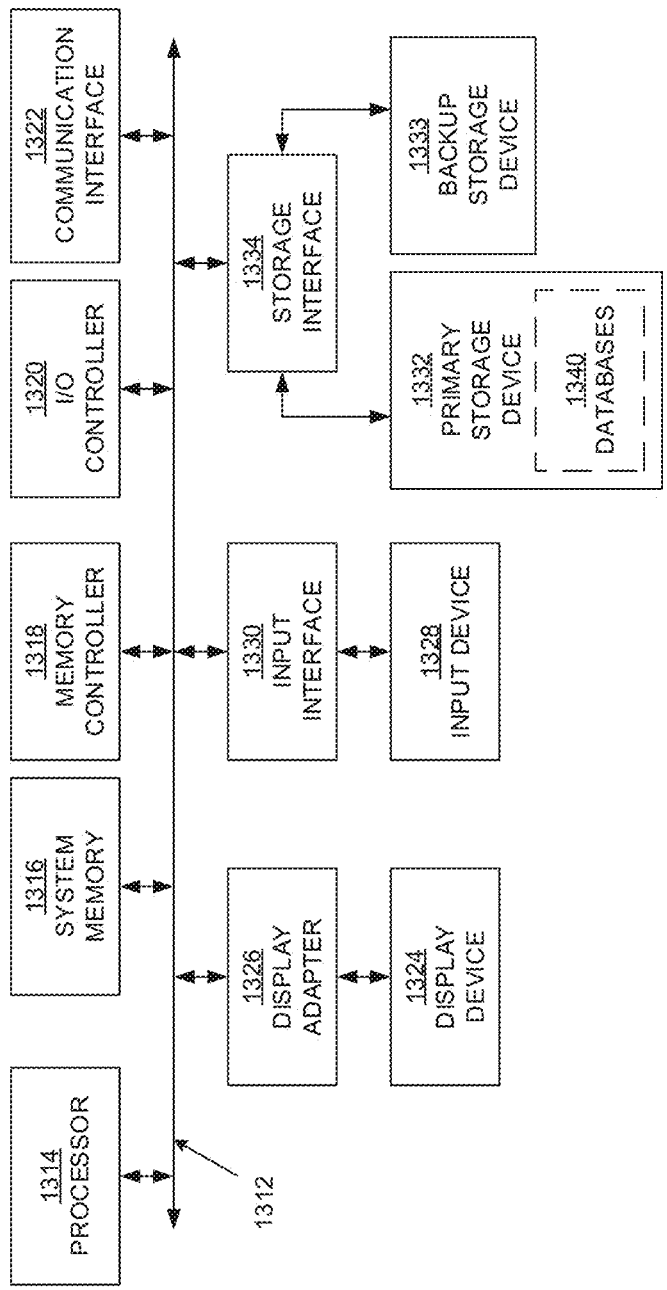
FIG. 13 is a block diagram of an exemplary computing system including various embodiments.

FIG. 13 is a block diagram of an exemplary computing system 1300 including various embodiments. Computing system 1300 broadly represents any single or multi-processor computing device or system capable of executing computer-readable instructions. Examples of computing system 1300 include, without limitation, workstations, laptops, client-side terminals, servers, supercomputers, distributed computing systems, handheld devices, or any other computing system or device. In its most basic configuration, computing system 1300 may include at least one processor 1314 and a system memory 1316.

Processor 1314 generally represents any type or form of processing unit capable of processing data or interpreting and executing instructions. In certain embodiments, processor 1314 may receive instructions from a software application or module. These instructions may cause processor 1314 to perform the functions of one or more of the example embodiments described and/or illustrated herein. For example, processor 1314 may perform and/or be a means for performing, either alone or in combination with other elements, one or more of the identifying, determining, using, implementing, translating, tracking, receiving, moving, and providing described herein. Processor 1314 may also perform and/or be a means for performing any other steps, methods, or processes described and/or illustrated herein.

System memory 1316 generally represents any type or form of volatile or non-volatile storage device or medium capable of storing data and/or other computer-readable instructions. Examples of system memory 1316 include, without limitation, RAM, ROM, FLASH memory, or any other suitable memory device. Although not required, in certain embodiments computing system 1300 may include both a volatile memory unit (such as, for example, system memory 1316) and a non-volatile storage device (such as, for example, primary storage device 1332.

Computing system 1300 may also include one or more components or elements in addition to processor 1314 and system memory 1316. For example, in the embodiment of FIG. 13, computing system 1300 includes a memory controller 1318, an I/O controller 1320, and a communication interface 1322, each of which may be interconnected via a communication infrastructure 1312.

Communication infrastructure 1312 generally represents any type or form of infrastructure capable of facilitating communication between one or more components of a computing device. Examples of communication infrastructure 1312 include, without limitation, a communication bus (such as an ISA, PCI, PCIe, or similar bus) and a network. In one embodiment, system memory 1316 communicates via a dedicated memory bus.

Memory controller 1318 generally represents any type or form of device capable of handling memory or data or controlling communication between one or more components of computing system 1300. For example, memory controller 1318 may control communication between processor 1314, system memory 1316, and I/O controller 1320 via communication infrastructure 1312. Memory controller may perform and/or be a means for performing, either alone or in combination with other elements, one or more of the operations or features described herein.

I/O controller 1320 generally represents any type or form of module capable of coordinating and/or controlling the input and output functions of a computing device. For example, I/O controller 1320 may control or facilitate transfer of data between one or more elements of computing system 1300, such as processor 1314, system memory 1316, communication interface 1322, display adapter 1326, input interface 1330, and storage interface 1334. I/O controller 1320 may be used, for example, to perform and/or be a means for performing, either alone or in combination with other elements, one or more of the operations described herein. I/O controller 1320 may also be used to perform and/or be a means for performing other operations and features set forth in the instant disclosure.

Communication interface 1322 broadly represents any type or form of communication device or adapter capable of facilitating communication between example computing system 1300 and one or more additional devices. For example, communication interface 1322 may facilitate communication between computing system 1300 and a private or public network including additional computing systems. Examples of communication interface 1322 include, without limitation, a wired network interface (such as a network interface card), a wireless network interface (such as a wireless network interface card), a modem, and any other suitable interface. In one embodiment, communication interface 1322 provides a direct connection to a remote server via a direct link to a network, such as the Internet. Communication interface 1322 may also indirectly provide such a connection through, for example, a local area network (such as an Ethernet network), a personal area network, a telephone or cable network, a cellular telephone connection, a satellite data connection, or any other suitable connection.

Communication interface 1322 may also represent a host adapter configured to facilitate communication between computing system 1300 and one or more additional network or storage devices via an external bus or communications channel. Examples of host adapters include, without limitation, SCSI host adapters, USB host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 1322 may also allow computing system 1300 to engage in distributed or remote computing. For example, communication interface 1322 may receive instructions from a remote device or send instructions to a remote device for execution. Communication interface 1322 may perform and/or be a means for performing, either alone or in combination with other elements, one or more of the operations disclosed herein. Communication interface 1322 may also be used to perform and/or be a means for performing other operations and features set forth in the instant disclosure.

As illustrated in FIG. 13, computing system 1300 may also include at least one display device 1324 coupled to communication infrastructure 1312 via a display adapter 1326. Display device 1324 generally represents any type or form of device capable of visually displaying information forwarded by display adapter 1326. Similarly, display adapter 1326 generally represents any type or form of device configured to forward graphics, text, and other data from communication infrastructure 1312 (or from a frame buffer, as known in the art) for display on display device 1324.

As illustrated in FIG. 13, computing system 1300 may also include at least one input device 1328 coupled to communication infrastructure 1312 via an input interface 1330. Input device 1328 generally represents any type or form of input device capable of providing input, either computer- or human-generated, to computing system 1300. Examples of input device 1328 include, without limitation, a keyboard, a pointing device, a speech recognition device, or any other input device. In one embodiment, input device 1328 may perform and/or be a means for performing, either alone or in combination with other elements, one or more of the operations disclosed herein. Input device 1328 may also be used to perform and/or be a means for performing other operations and features set forth in the instant disclosure.

As illustrated in FIG. 13, computing system 1300 may also include a primary storage device 1332 and a backup storage device 1333 coupled to communication infrastructure 1312 via a storage interface 1334. Storage devices 1332 and 1333 generally represent any type or form of storage device or medium capable of storing data and/or other computer-readable instructions. For example, storage devices 1332 and 1333 may be a magnetic disk drive (e.g., a so-called hard drive), a solid state disk, a floppy disk drive, a magnetic tape drive, an optical disk drive, a FLASH drive, or the like. Storage interface 1334 generally represents any type or form of interface or device for transferring data between storage devices 1332 and 1333 and other components of computing system 1300.

In one example, databases 1340 may be stored in primary storage device 1332. Databases 1340 may represent portions of a single database or computing device or a plurality of databases or computing devices. For example, databases 1340 may represent (be stored on) a portion of computing system 1300 and/or portions of example network architecture 1400 in FIG. 14 (below). Alternatively, databases 1340 may represent (be stored on) one or more physically separate devices capable of being accessed by a computing device, such as computing system 1300 and/or portions of network architecture 1400.

Continuing with reference to FIG. 13, storage devices 1332 and 1333 may be configured to read from and/or write to a removable storage unit configured to store computer software, data, or other computer-readable information. Examples of suitable removable storage units include, without limitation, a floppy disk, a magnetic tape, an optical disk, a FLASH memory device, or the like. Storage devices 1332 and 1333 may also include other similar structures or devices for allowing computer software, data, or other computer-readable instructions to be loaded into computing system 1300. For example, storage devices 1332 and 1333 may be configured to read and write software, data, or other computer-readable information. Storage devices 1332 and 1333 may also be a part of computing system 1300 or may be separate devices accessed through other interface systems.

Storage devices 1332 and 1333 may be used to perform, and/or be a means for performing, either alone or in combination with other elements, one or more of the operations disclosed herein. Storage devices 1332 and 1333 may also be used to perform, and/or be a means for performing, other operations and features set forth in the instant disclosure.

Many other devices or subsystems may be connected to computing system 1300. Conversely, all of the components and devices illustrated in FIG. 13 need not be present to practice the embodiments described herein. The devices and subsystems referenced above may also be interconnected in different ways from that shown in FIG. 13. Computing system 1300 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 1300. All or a portion of the computer program stored on the computer-readable medium may then be stored in system memory 1316 and/or various portions of storage devices 1332 and 1333. When executed by processor 1314, a computer program loaded into computing system 1300 may cause processor 1314 to perform and/or be a means for performing the functions of the example embodiments described and/or illustrated herein. Additionally or alternatively, the example embodiments described and/or illustrated herein may be implemented in firmware and/or hardware. For example, computing system 1300 may be configured as an ASIC adapted to implement one or more of the embodiments disclosed herein.

Figure 14:
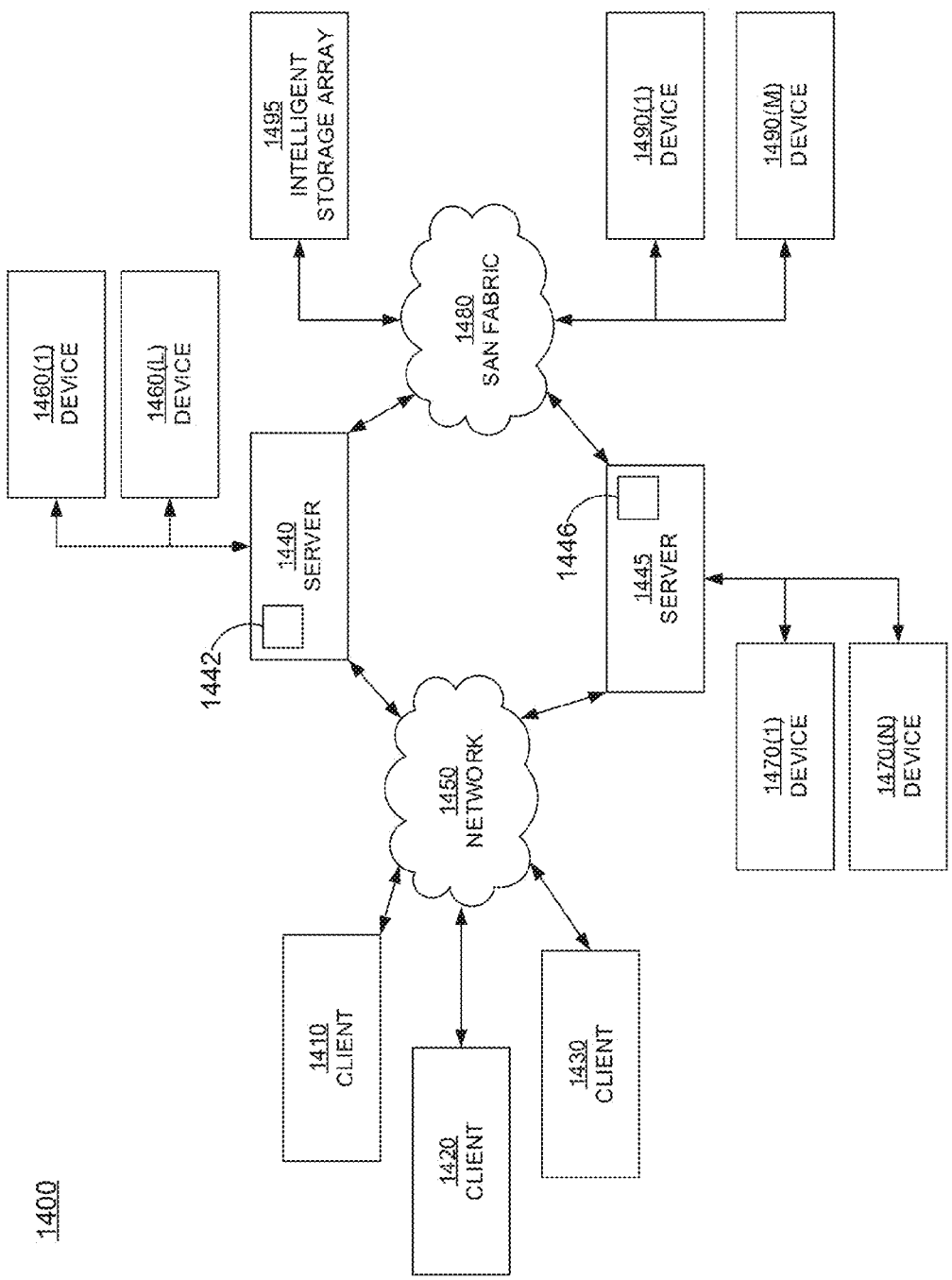
FIG. 14 is a block diagram of an exemplary operating environment, in accordance with various embodiments.

FIG. 14 is a block diagram of an exemplary operating environment 1400 in which client systems 1410, 1420, and 1430 and servers 1440 and 1445 may be coupled to a network 1450. Client systems 1410, 1420, and 1430 generally represent any type or form of computing device or system, such as computing system 1300 of FIG. 13.

Similarly, servers 1440 and 1445 generally represent computing devices or systems, such as application servers or database servers, configured to provide various database services and/or run certain software applications. In some embodiments, the servers 1440 may include processor and memory systems 1442, as described herein. In some embodiments, the servers 1445 may include one or more processor and memory systems 1446, as described herein. Network 1450 generally represents any telecommunication or computer network including, for example, an intranet, a WAN, a LAN, a PAN, or the Internet.

As illustrated in FIG. 14, one or more storage devices 1460(1)-(L) may be directly attached to server 1440. Similarly, one or more storage devices 1470(1)-(N) may be directly attached to server 1445. Storage devices 1460(1)-(L) and storage devices 1470(1)-(N) generally represent any type or form of storage device or medium capable of storing data and/or other computer-readable instructions. Storage devices 1460(1)-(L) and storage devices 1470(1)-(N) may represent NAS devices configured to communicate with servers 1440 and 1445 using various protocols, such as NFS, SMB, or CIFS.

Servers 1440 and 1445 may also be connected to a SAN fabric 1480. SAN fabric 1480 generally represents any type or form of computer network or architecture capable of facilitating communication between storage devices. SAN fabric 1480 may facilitate communication between servers 1440 and 1445 and storage devices 1490(1)-(M) and/or an intelligent storage array 1495. SAN fabric 1480 may also facilitate, via network 1450 and servers 1440 and 1445, communication between client systems 1410, 1420, and 1430 and storage devices 1490(1)-(M) and/or intelligent storage array 1495 in such a manner that devices 1490(1)-(M) and array 1495 appear as locally attached devices to client systems 1410, 1420, and 1430. As with storage devices 1460(1)-(L) and storage devices 1470(1)-(N), storage devices 1490(1)-(M) and intelligent storage array 1495 generally represent any type or form of storage device or medium capable of storing data and/or other computer-readable instructions.

With reference to computing system 1300 of FIG. 13, a communication interface, such as communication interface 1322, may be used to provide connectivity between each client system 1410, 1420, and 1430 and network 1450. Client systems 1410, 1420, and 1430 may be able to access information on server 1440 or 1445 using, for example, a Web browser or other client software. Such software may allow client systems 1410, 1420, and 1430 to access data hosted by server 1440, server 1445, storage devices 1460(1)-(L), storage devices 1470(1)-(N), storage devices 1490(1)-(M), or intelligent storage array 1495. Although FIG. 14 depicts the use of a network (such as the Internet) for exchanging data, the embodiments described herein are not limited to the Internet or any particular network-based environment.

The above described embodiments may be used, in whole or in part, in systems that process large amounts of data and/or have tight latency constraints, and, in particular, with systems using one or more of the following protocols and formats: Key-Value (KV) Store, Memcached, Redis, Neo4J (Graph), Fast Block Storage, Swap Device, and Network RAMDisk. In addition, the above described embodiments may be used, in whole or in part, in systems employing virtualization, Virtual Desktop Infrastructure (VDI), distributed storage and distributed processing (e.g., Apache Hadoop), data analytics cluster computing (e.g., Apache Spark), Infrastructure as a Service (IaaS), Platform as a Service (PaaS), and other cloud computing platforms (e.g., Vmware vCloud, Open Stack, and Microsoft Azure). Further, the above described embodiments may be used, in whole or in party, in systems conducting various types of computing, including Scale Out, Disaggregation, Multi-Thread/Distributed Processing, RackScale, Data Center Scale Computing, Elastic Memory Provisioning, Memory as a Service, page migration and caching and Application Offloading/Acceleration and Integration, using various types of storage, such as Non-Volatile Memory Express, Flash, Multi-Tenancy, Internet Small Computer System Interface (iSCSI), Object Storage, Scale Out storage, and using various types of networking, such as 10/40/100 GbE, Software-Defined Networking, Silicon Photonics, Rack TOR Networks, and Low-Latency networking.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

What is claimed is:

1. A method for transferring data between memory modules, the method comprising:
  sending a read request to a first memory module, the first memory module comprising one or more non-volatile memory devices;

sending a write request to a second memory module, the second memory module comprising one or more volatile memory devices, wherein the write request comprises an indicator that the second memory module is to capture data from a data bus, the data sent directly from the first memory module;

in response to the read request, sending data from the first memory module on the data bus, wherein the data bus electrically couples the first memory module, the second memory module, and a processor; and in response to the write request, storing the data from the data bus into the second memory module.

2. The method of claim 1, wherein the first memory module and the second memory modules are dual in-line memory modules (DIMMs) and the data is transferred directly from the first memory module to the second memory module via the data bus, wherein the first memory module and the second memory module share the data bus.

3. The method of claim 1, wherein the data stored into the second memory module is received directly from the first memory module via the data bus.

4. The method of claim 1 further comprising:
accessing the data via the data bus using a buffer; and performing error checking on the data using the buffer.

5. The method of claim 4 further comprising:
in response to determining an error based on the error checking, sending an error indicator to the second memory module.

6. The method of claim 1 further comprising:
performing an initialization process for a direct transfer of data from the first memory module to the second memory module.

7. A system comprising:
a processor;
a first memory module comprising one or more non-volatile memory devices;
a second memory module comprising one or more volatile memory devices; and
a memory bus coupling the processor, the first memory module, and the second memory module, wherein the processor is configured to initiate a copy operation of data of the first memory module directly to the second memory module by sending a read request to the first memory module and a write request to the second memory module, wherein the write request comprises an indicator that the second memory module is to capture data from the memory bus, the data sent directly from the first memory module; and wherein the first memory module is configured to send data on the memory bus in response to the read request, and wherein the second memory module is configured to store the data from the memory bus into the second memory module.

8. The system of claim 7, wherein the first memory module and the second memory modules are dual in-line memory modules (DIMMs) and the data is transferred directly from the first memory module to the second memory module via the memory bus, wherein the first memory module and the second memory module share the memory bus.

9. The system of claim 7 further comprising:
a buffer configured to transmit a data signal and a data strobe signal with different phase alignments.

10. The system of claim 7 further comprising a system board comprising the buffer.

11. The system of claim 7 further comprising:
a buffer configured to receive a data signal and a data strobe signal having a same phase alignment and further configured to transmit the data signal and the data strobe signal with a different phase alignment.

12. The system of claim 11, wherein the second memory module comprises the buffer.

13. The system of claim 11, wherein the first memory module comprises the buffer.

14. The system of claim 7, wherein the processor is configured to perform an error check operation on the data on the memory bus and in response to determining an error therefrom, the processor is further configured to contemporaneously signal the second memory module to cancel the write request.

15. The system of claim 7, wherein the processor is configured to perform an initialization process for a direct transfer of data from the first memory module to the second memory module.

16. A method for copying data, the method comprising:
receiving a copy request to copy data, wherein the copy request comprises a source address and a destination address;
determining whether a first memory module associated with the source address and a second memory module associated with the destination address are coupled to a memory bus;
in response to determining the first memory module and the second memory module are coupled to the memory bus, sending a read request to a first memory module, the first memory module comprising one or more non-volatile memory devices, wherein the first memory module is configured to send data associated with the source address over the memory bus; and
sending a write request to the second memory module, wherein the write request comprises an indicator that the second memory module is to capture data from the memory bus, the data sent directly from the first memory module, and the second memory module comprising one or more volatile memory devices, wherein in response to the write request the second memory module accesses the data from the memory bus.

17. The method of claim 16, wherein the first memory module and the second memory modules are dual in-line memory modules (DIMMs) and the data is transferred directly from the first memory module to the second memory module via the memory bus, wherein the first memory module and the second memory module share the memory bus.

18. The method of claim 16 further comprising:
sending a signal to a processor to perform an error checking process on the data on the memory bus.

19. The method of claim 18 further comprising:
in response to the processor determining an error as a result of the error checking process, receiving an error signal from the processor.

20. The method of claim 16, wherein the first memory module comprises non-volatile memory.

* * * * *